United States Patent [19]
Ju

[11] Patent Number: 5,655,375
[45] Date of Patent: Aug. 12, 1997

[54] ANTENNA MAST-TOP MOUNTABLE THERMO-ELECTRICALLY COOLED AMPLIFIER ENCLOSURE SYSTEM

[75] Inventor: Chang Ho Ju, Yorba Linda, Calif.

[73] Assignee: Y.B.S. Enterprises, Inc., Los Angeles, Calif.

[21] Appl. No.: 669,153

[22] Filed: Jun. 24, 1996

[51] Int. Cl.$^6$ .................................................. F25B 21/02
[52] U.S. Cl. ............................... 62/3.6; 62/3.2; 62/259.2; 62/208; 361/695
[58] Field of Search ............................ 62/3.2, 3.3, 3.6, 62/3.7, 259.2, 208, 209; 361/690, 694, 695, 696, 697, 701, 702, 703

[56] References Cited

U.S. PATENT DOCUMENTS

| | | | |
|---|---|---|---|
| 2,932,953 | 4/1960 | Becket et al. | 62/3.6 |
| 4,328,676 | 5/1982 | Reed | 62/3.2 |

*Primary Examiner*—John M. Sollecito

[57] ABSTRACT

An antenna mast-top mountable thermo-electrically cooled amplifier enclosure system comprising an enclosure means, a thermo-electric cooler or TEC having a cold side and a hot side mounted on the enclosure so that the hot side faces outwards, an amplifier means mounted directly on the cold side of the TEC, a heat sink means directly mounted on the hot side of the TEC. An internal fan circulates and distributes cold air inside the enclosure and an external fan near the heat sink provides rapid cooling of the heat sink. A band pass filter and a duplexer can also be mounted on the cold side of the TEC. A plurality of connectors are mounted on the enclosure to provide input and output connections as needed. A plurality of mounting flanges are used to secure the enclosure to any mountable surface or device. A temperature sensor mounted on the enclosure detects internal temperature and a temperature sensor mounted on the amplifier detects amplifier temperature. An external computer control monitors the two temperatures and ambient temperature and causes an external polarity switcher which is electrically connected to an external power supply to switch the polarity of the current being provided to the TEC. The system can be switched vice versa to cool or heat the system.

6 Claims, 2 Drawing Sheets

ANTENNA MAST-TOP MOUNTABLE THERMO-ELECTRICALLY COOLED AMPLIFIER ENCLOSURE SYSTEM

BACKGROUND OF THE INVENTION

1. Field of the Invention

The present invention generally relates to an communications transmitter and receiver or transceiver apparatus and particularly to an antenna mast-top mountable thermo-electrically cooled amplifier enclosure system.

2. Description of the Prior Art

In communications systems in general and in cellular communications systems in particular, transceivers are crucial sub-systems and power amplifiers such as LNA, LPA, HPA, SSPA and TWTA are one of its crucial components. Power amplifiers, being integral components of transceivers, need to be kept cooled at operating temperature. Traditionally, cooling of electronic systems in enclosures was achieved by natural convection using heat sinks having fins. In many cases, systems relying on natural convection resulted in failure due to inadequate cooling. Another traditional method of cooling electronic systems in enclosures is using fans to cool the internal air and pulling it outside of the enclosure. This method also tend to be inadequate or fail prematurely due to moving parts inherently involved. Yet another traditional method of cooling electronic systems in enclosures is to use refrigerants in heat exchangers. Such method relied on pumping refrigerants through the system and quite often result in environmentally unsafe conditions.

The amplifier can be separated from the transceiver and cooled separately using thermo-electric cooler or TEC. TEC is a well-known solid-state device utilizing Peltier effect and semi-conductor and is primarily used to cool computer CPU's and coinoperated vending machines. However, by cascading TEC's, amplifiers in the communications field can be adequately cooled. Furthermore, TEC's offer the advantages of having no moving parts or being solid-state, thereby minimizing failure rate. Optionally, the TEC can be used in conjunction with fans whereby TEC can alleviate substantial cooling load from the fan so that the fan can be used to simply move the air inside the enclosure.

By separating the amplifier from the transceiver and cooling the amplifier with TEC's, the amplifiers such as LNA, LPA, HPA, SSPA and TWTA can be placed at top of antenna mast and therefore near the antenna dish. This offers a significant advantage in that such configuration drastically reduces cable losses due to its minimal cable length.

Furthermore, by switching the electrical polarity of the current inputs on the TEC, the TEC can be used to heat the same system or component.

It is thus a primary objective of the present invention to provide an antenna mast-top mountable thermo-electrically cooled amplifier enclosure system which utilizes thermo-electric coolers to provide cooling or heating to amplifiers.

Another objective of the present invention is to provide an antenna mast-top mountable thermo-electrically cooled amplifier enclosure system which by using thermo-electric coolers provides solid-state cooling or heating.

Yet another objective of the present invention is to provide an antenna mast-top mountable thermo-electrically cooled amplifier enclosure system which by using thermo-electric coolers eliminate uses of refrigerants.

Still another objective of the present invention is to provide an antenna mast-top mountable thermo-electrically cooled amplifier enclosure system which by cooling or heating the amplifier separately allows the amplifier to be mounted close to the antenna dish.

SUMMARY OF THE INVENTION

The antenna mast-top mountable thermo-electrically cooled amplifier enclosure system comprising an enclosure means, a thermo-electric cooler or TEC having a cold side and a hot side mounted on the enclosure so that the hot side faces outwards, an amplifier means mounted directly on the cold side of the TEC, a heat sink means directly mounted on the hot side of the TEC. An internal fan circulates and distributes cold air inside the enclosure and an external fan near the heat sink provides rapid cooling of the heat sink. A band pass filter and a duplexer can also be mounted on the cold side of the TEC. A plurality of connectors are mounted on the enclosure to provide input and output connections as needed. A plurality of mounting flanges are used to secure the enclosure to any mountable surface or device. A temperature sensor mounted on the enclosure detects internal temperature and a temperature sensor mounted on the amplifier detects amplifier temperature. An external computer control monitors the two temperatures and ambient temperature and causes an external polarity switcher which is electrically connected to an external power supply to switch the polarity of the current being provided to the TEC. The system can be switched vice versa to cool or Heat the system.

These together with other objects of the invention are pointed out clearly in the claims annexed to and forming a part of this disclosure. For a better understanding of the present invention, its operating advantages and the specific objects attained by its use, references should be made to the accompanying drawings and descriptive matter in which there are illustrated preferred embodiments of the invention.

BRIEF DESCRIPTION OF THE DRAWINGS

For a better understanding of the principle and nature of the present invention, references should be made to the following detailed description taken in consideration of the accompanying drawings in which.

DETAILED DESCRIPTION OF THE PREFERRED EMBODIMENT

Figure 1:
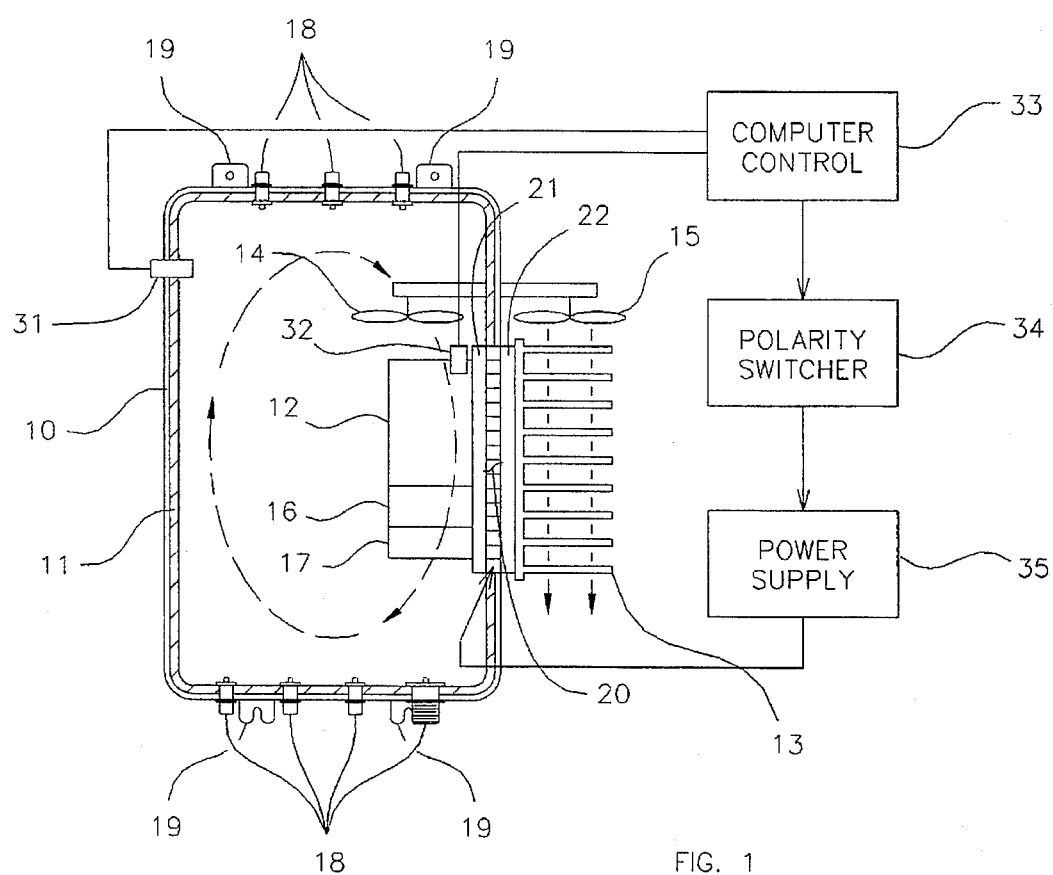
FIG. 1 is an elevational sectional view of the present invention showing all the elements.

Referring to FIG. 1, the antenna mast-top mountable thermo-electrically cooled amplifier enclosure system comprises an enclosure means 10 having an insulation layer 11 attached on its inner side, a thermo-electric cooler or TEC 20 having a cold side 21 and a hot side 22 mounted on the enclosure 10 so that the hot side 22 faces outwards with respect to the enclosure 10, an amplifier means 12 or LNA or LPA or HPA or SSPA or TWTA mounted directly on the cold side 21 of the TEC 20, a heat sink means 13 directly mounted on the hot side 22 of the TEC 20. An optional internal fan 14 may be installed inside the enclosure 10 to circulate and distribute the cold air inside the enclosure 10. An external fan 15 may be installed outside the enclosure 10 and near the heat sink 13 to provide rapid cooling of the hot side 22 and the heat sink 13. A band pass filter 16 and a duplexer 17 are also mounted on the cold side 21 of the TEC 20. A plurality of connectors 18 are mounted on the enclosure 10 to provide input and output connections as needed. A plurality of mounting flanges 19 are used to secure the enclosure 10 to any mountable surface or device.

A temperature sensor 31 mounted on the enclosure 10 detects internal temperature of the enclosure 10 and a temperature sensor 32 mounted on the amplifier 12 detects temperature of the amplifier 12. Both temperature sensors 31 and 32 are electrically connected to an external computer control 33. The external computer control 33 is in turn electrically connected to an external polarity switcher 34 which is electrically connected to an external power supply 35. The power supply 35 is electrically connected to the TEC 20 to provide necessary current. Depending on the internal temperature of the enclosure 10 and ambient temperature, the polarity of the current being provided to the TEC 20 can be switched and vice versa to cool or heat the system.

In operation, the power supply 35 provides current to the TEC 20 to cool the TEC 20. This results in a certain temperature difference between the cold side 21 and the hot side 22 Of the TEC 20. The amplifier 12 mounted directly on the TEC 20 is directly cooled and the fan 14 blowing on the cold side 21 of the TEC 20 circulates the cold air throughout the enclosure 10. The hot side 22 and the heat sink 13, with the aid of fan 15, rapidly dissipate heat generated from the amplifier 12 and other components.

The computer control 33 continuously monitors and compares the relevant temperatures and, depending on the prevalent situation, may reverse the polarity of the current being provided to the TEC 20 to heat the enclosure 10.

Figure 2:
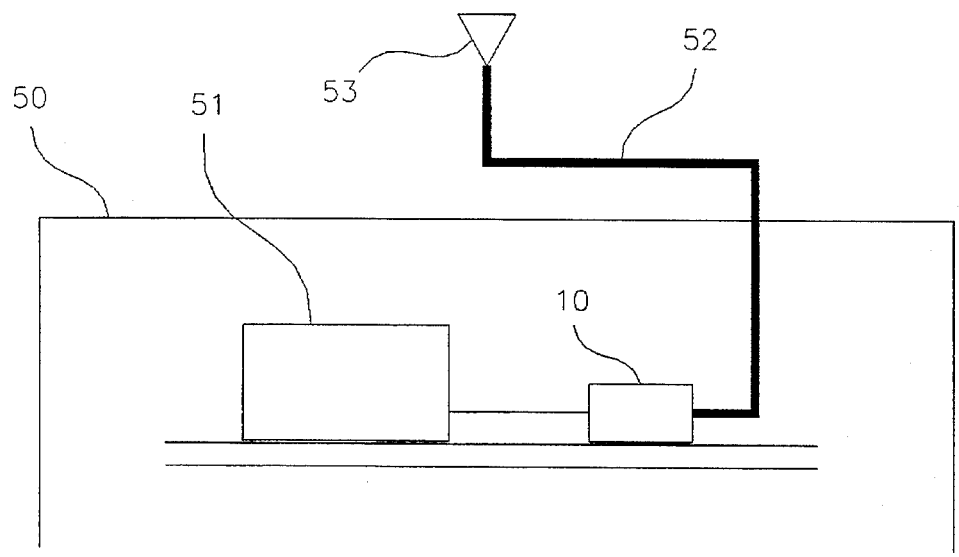
FIG. 2 is a diagram showing the traditional layout of transceiver and antenna system.
Figure 3:
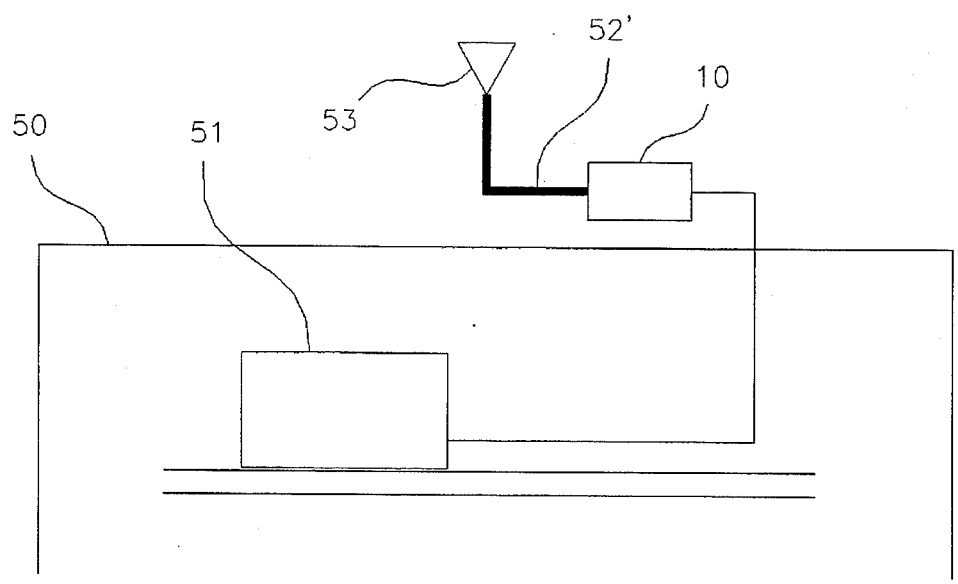
FIG. 3 is a diagram showing the present invention placed near the antenna.

In traditional communications system with transceiver 51 and antenna 53 as illustrated in FIG. 2, the amplifier 12 is placed near the transceiver 51 inside a building 50 necessitating a cable 52 with substantial length and resulting in substantial signal loss. The present invention's configuration allows the enclosure 10 having amplifier 12 to be mounted near the antenna 53. This proximity results in cable 52' with short cable length and therefore extremely low cable loss from the enclosure 10 having amplifier 12 to the antenna 53, as illustrated in FIG. 3.

In alternative embodiment, pluralities of TEC's 20, amplifiers 12, band pass filters 16 and duplexers 17 may be utilized in the present invention.

In another alternative embodiment, the amplifier 12 may be mounted elsewhere in the enclosure 10 and not on the TEC 20. In such configuration, the internal fan 14 will blow on the cold side 21 of the TEC 20 and circulate and distribute the cold air to the amplifier 12 and then throughout the enclosure 10—resulting in indirect cooling.

While the present invention has been disclosed with reference to a particular example of preferred embodiment, it is the applicant's intention to cover all modifications and equivalents within the scope of the following appended claims. It is therefore requested that the following claims be given a liberal interpretation which is within the spirit and scope of the applicant's contribution to this art.

What is claimed as being new and therefore desired to be protected by letter patent of the United States is as follows:

1. An antenna mast-top mountable thermo-electrically cooled amplifier enclosure system comprising:
   a) an enclosure means having an insulation layer attached therein;
   b) a thermo-electric cooler having a cold side and a hot side, wherein said thermo-electric cooler is mounted on said enclosure so that said hot side faces outward with respect to said enclosure;
   c) a plurality of amplifier means is attached to said cold side of said thermo-electric cooler;
   d) a heat sink means attached to said hot side of said thermo-electric cooler;
   e) an internal fan mounted inside said enclosure and near said cold side of thermo-electric cooler;
   f) an external fan mounted outside said enclosure and near said heat sink means;
   g) a plurality of mounting flanges attached to base of said enclosure;
   h) a temperature sensor mounted on said enclosure;
   i) a temperature sensor mounted on said amplifier;
   j) an external computer control, wherein said computer control is electrically connected to said temperature sensors of said enclosure and of said amplifier;
   k) an external polarity switcher electrically connected to said computer control; and
   l) an external power supply electrically connected to said polarity switcher.

2. An antenna mast-top mountable thermo-electrically cooled amplifier enclosure system comprising:
   a) an enclosure means having an insulation layer attached therein;
   b) a thermo-electric cooler having a cold side and a hot side, wherein said thermo-electric cooler is mounted on said enclosure so that said hot side faces outward with respect to said enclosure;
   c) a plurality of amplifier means is attached inside said enclosure;
   d) a heat sink means attached to said hot side of said thermo-electric cooler;
   e) an internal fan mounted inside said enclosure and near said cold side of thermo-electric cooler;
   f) an external fan mounted outside said enclosure and near said heat sink means;
   g) a plurality of mounting flanges attached to base of said enclosure;
   h) a temperature sensor mounted on said enclosure;
   i) a temperature sensor mounted on said amplifier;
   j) an external computer control, wherein said computer control is electrically connected to said temperature sensors of said enclosure and of said amplifier;
   k) an external polarity switcher electrically connected to said computer control; and
   l) an external power supply electrically connected to said polarity switcher, wherein said power supply supplies electric current to said thermo-electric cooler.

3. The antenna mast-top mountable thermo-electrically cooled amplifier enclosure system as set forth in claim 1 or 2, wherein said amplifier comprises LNA, LPA, HPA, SSPA or TWTA.

4. The antenna mast-top mountable thermo-electrically cooled amplifier enclosure system as set forth in claim 3, wherein a band pass filter is mounted on said cold side of said thermo-electric cooler.

5. The antenna mast-top mountable thermo-electrically cooled amplifier enclosure system as set forth in claim 3, wherein a duplexer is mounted on said cold side of said thermo-electric cooler.

6. The antenna mast-top mountable thermo-electrically cooled amplifier enclosure system as set forth in claim 3, wherein switching polarity on said power supply reverses cooling or heating of said thermo-electric cooler.

* * * * *